United States Patent [19]

Lidow

[11] Patent Number: 4,789,882
[45] Date of Patent: Dec. 6, 1988

[54] HIGH POWER MOSFET WITH DIRECT CONNECTION FROM CONNECTION PADS TO UNDERLYING SILICON

[75] Inventor: Alexander Lidow, Hermosa Beach, Calif.

[73] Assignee: International Rectifier Corporation, Los Angeles, Calif.

[21] Appl. No.: 477,012

[22] Filed: Mar. 21, 1983

[51] Int. Cl.⁴ .............................................. H21L 24/78
[52] U.S. Cl. ..................................... 357/23.4; 357/43; 357/48; 357/55; 357/68
[58] Field of Search ................... 53/23 C, 23 VD, 43, 53/48, 55, 68

[56] References Cited

U.S. PATENT DOCUMENTS 3,271,201 9/1966 Pomerantz ............................ 357/55
3,812,521 5/1974 Davis et al. .......................... 357/48
4,143,387 3/1979 Stikvoort ......................... 357/23 VD

FOREIGN PATENT DOCUMENTS 54-112179 9/1979 Japan ............................ 357/23 VD

OTHER PUBLICATIONS

Hexfet Databook, ©1981, International Rectifier Corp., pp. 1,6,7,96,97.

Primary Examiner—Joseph E. Clawson, Jr.
Attorney, Agent, or Firm—Ostrolenk, Faber, Gerb & Soffen

[57] ABSTRACT

The gate electrode pad and the source electrode pad of a high power MOSFET are supported atop an oxide layer. The peripheral regions of the source electrode which surround the areas of the gate and source pads are connected at a plurality of points around their peripheries through the oxide layer to the underlying silicon. This enables rapid collection of minority carriers which were weakly injected into the region surrounding the pads when a junction beneath the pads is forward-biased.

7 Claims, 2 Drawing Sheets

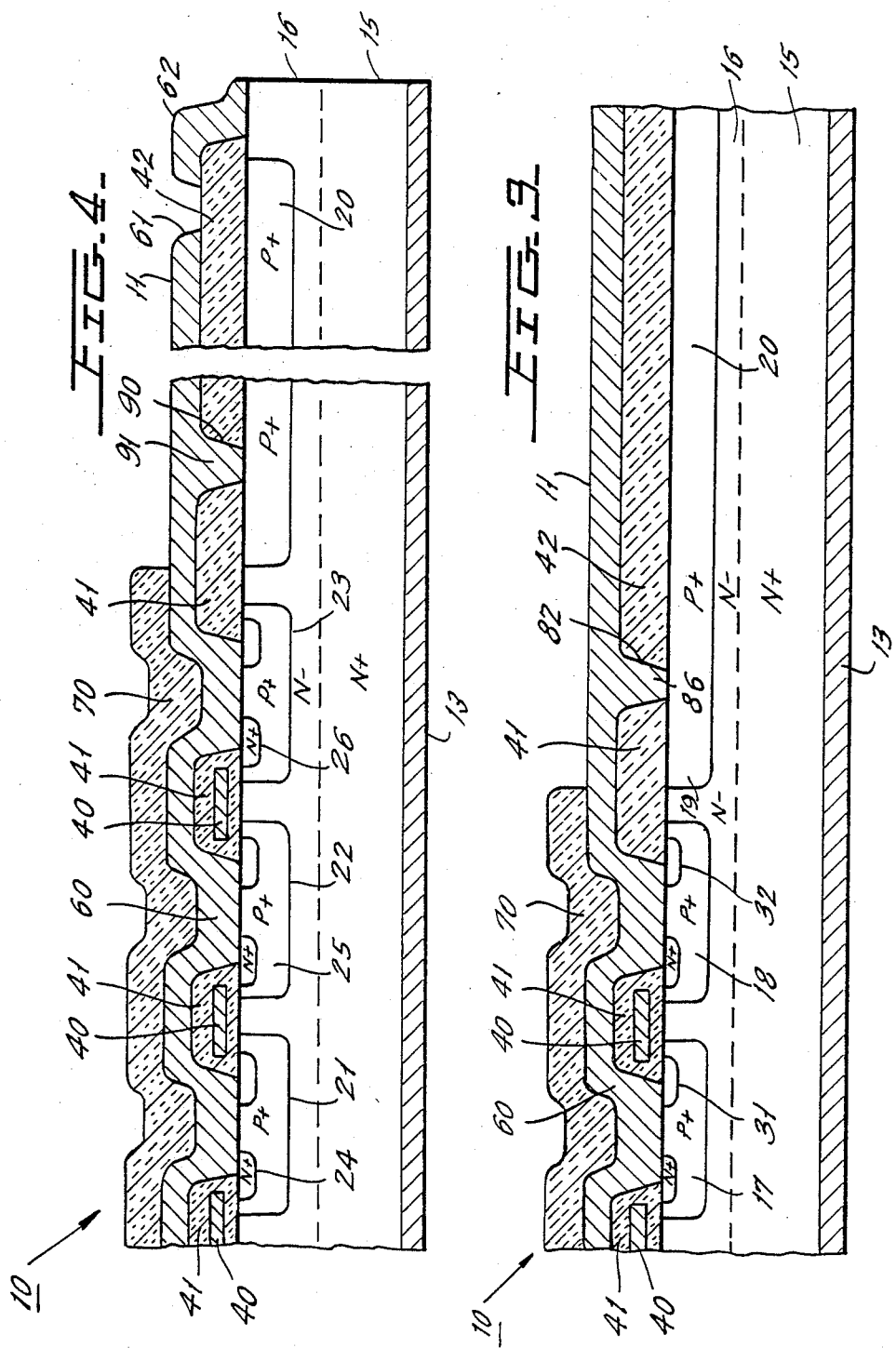

HIGH POWER MOSFET WITH DIRECT CONNECTION FROM CONNECTION PADS TO UNDERLYING SILICON

BACKGROUND OF THE INVENTION

This invention relates to high power metal oxide semiconductor field effect transistors, and more specifically relates to a novel connection of the peripheries of the electrode pads of such devices directly to the underlying silicon to prevent failure of the device when it is operated in a diode mode.

High power metal oxide semiconductor field effect transistors (MOSFETS) which typically may be vertical conduction devices are well known. Commonly, such devices consist of a very large number of cells, which might be greater than 5,000, on a single small chip area with the devices all connected in electrical parallel. Typically, each cell may consist of a base region diffused into one surface of the main wafer or chip. A source region is formed within each base region and defines a conventional MOSFET channel. Each MOSFET channel underlies a conventional MOSFET gate which may be formed of polysilicon. The gate elements are connected together and can be connected to a common gate electrode pad, which is accessible on one surface of the chip, to which convenient gate connection can be made. Similarly, each of the sources is conventionally connected to a single sheet electrode which overlies the entire chip surface and which extends to a source electrode pad for making easy connection to the source of the device. The electrode pads are normally supported atop an oxide layer which is disposed between the pad surface and the underlying silicon wafer or chip surface. Conventionally, the silicon beneath the pad regions is of the same conductivity type of the cell base regions.

The source electrode which contacts each of the sources within each of the base regions also makes contact to a central portion of the cell base region. Consequently, the overall device acts as a single junction device or diode when the source electrode is one polarity, but as a MOSFET when the source electrode is of the other polarity. It has been found that MOSFET devices of the above structure experience failure during operation in a diode mode under particular circuit conditions. Upon inspection, it was discovered that failure occurred in the cell elements around the periphery of the electrode pads.

BRIEF DESCRIPTION OF THE INVENTION

In analyzing the above problem, it is recognized that when the device operates as a MOSFET, it operates as a majority carrier device so that each of the cells which are connected in parallel with one another will carry only its appropriate share of the load current. However, when the device is operated as a diode, it is operated as a minority carrier device and there is a tendency for diodes which carry more current than others to become locally heated. Thus, they tend to conduct still more current and this process continues until certain individual cells carry sufficient current to destroy the device. It has been discovered that this tendency for "hogging" current is more pronounced for those cellular elements which are disposed adjacent the edges of the connection pads of the device. The reason for this has been recognized to be that the region beneath the pads tends to weakly inject carriers into the underlying region, during the operation of the device. When the device is then operated as a diode, the carriers injected into the region under the pad periphery are very quickly collected by adjacent cell elements operating as individual parallel diodes since these cell elements are firmly connected to the source electrode. The regions under the pads, however, cannot collect this current since they are not firmly connected to the source electrode. Consequently, those diodes immediately adjacent the pad edges become immediately more highly conductive than cells remote from the pad periphery and they carry an even greater share of the current of the overall device until the cells fail.

With the discovery of the problem as stated above, wherein device failure is precipitated during the diode mode of operation by failure of the cell elements surrounding the pad, a plurality of direct connection points were made from the source electrode to the underlying silicon surface completely around the periphery of each of the source and gate pads. By making this direct connection, the base type material immediately under the pads becomes a very efficient collector of minority carriers which were previously injected beneath the pads during operation of the overall device as a diode. Consequently, these carriers are immediately swept up by the region beneath the pads rather than by adjacent cell elements so that the adjacent cell elements do not become more efficient diodes than the others, which would lead to their ultimate failure during operation in the diode mode.

RIEF DESCRIPTION OF THE DRAWINGS

FIG. 3 is a cross-sectional view of FIG. 2, taken across the section line 3—3 in FIG. 2 and further shows the electrodes atop the silicon surface of FIG. 2.

FIG. 4 is a view similar to that of FIG. 3, but shows the pads at the top and edge of the chip.

DETAILED DESCRIPTION OF THE DRAWINGS

Figure 1:
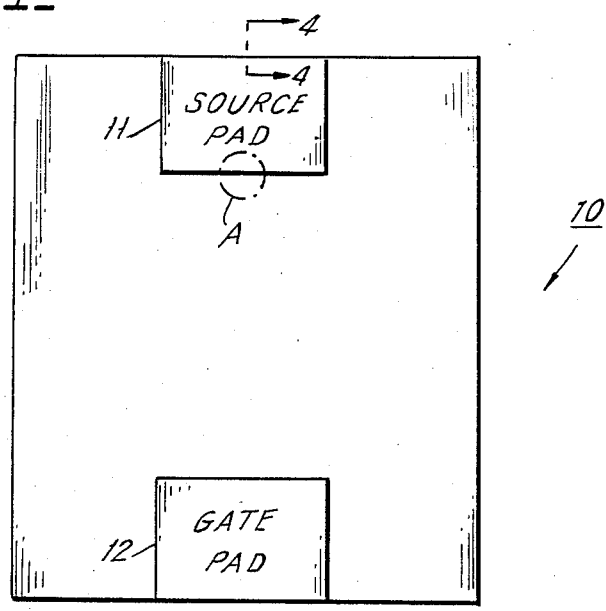
FIG. 1 is a plan view, greatly enlarged, of a typical MOSFET having a source pad and gate pad accessible for connection to source and gate leads on the upper surface of the device.

Referring first to FIG. 1, there is shown a semiconductor chip 10 which can be constructed in the manner disclosed in detail in copending application Ser. No. 451,795, filed Dec. 21, 1982, in the name of Daniel M. Kinzer, entitled "Structure and Method of Manufacture of High Power MOSFET Device" (IR-744). In general, the chip shown in FIG. 1 can have a length of about 100 mils and a width of about 100 mils and will contain therein greater than 6,000 individual MOSFET cells which are connected in parallel, as will be later described.

The chip surface contains a source pad 11 which is an exposed enlarged metallic surface which can be connected to a source wire lead. There is also a gate pad 12 which similarly is an enlarged exposed metallic surface to which a gate lead can be attached. The bottom surface of the device receives a drain electrode 13 (FIGS. 3 and 4).

Figure 2:
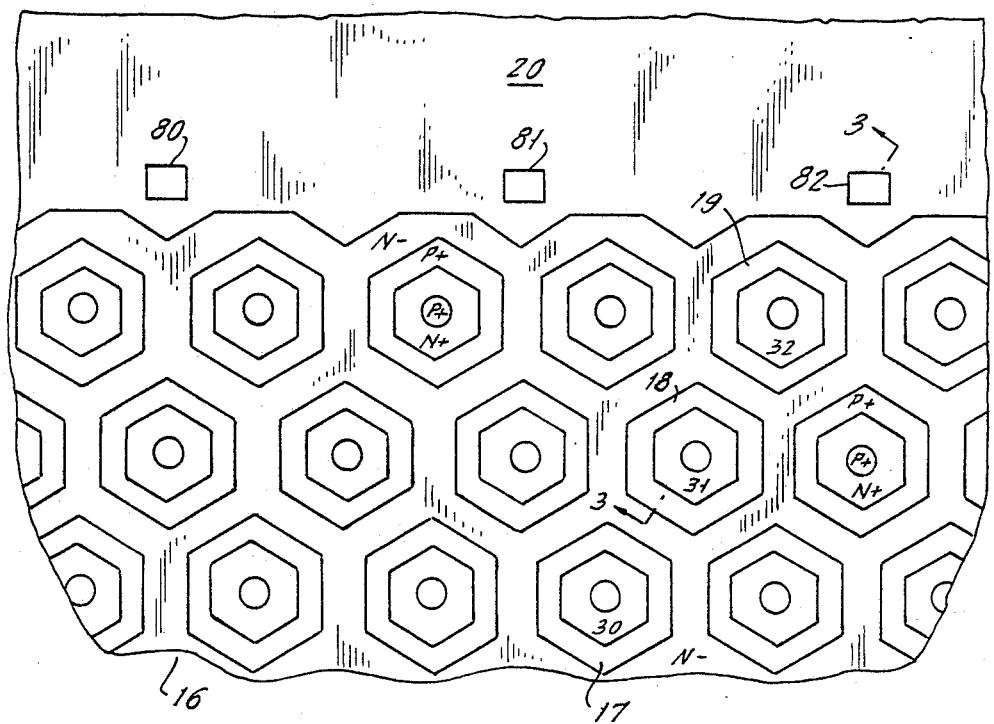
FIG. 2 is an enlarged view of the junction pattern of the silicon surface of the silicon chip of FIG. 1 and is a view greatly enlarged of the area within the circle marked "a" in FIG. 1.

The configuration of the individual MOSFET cells on the upper surface of the wafer or chip of FIG. 1 is shown in FIGS. 2, 3 and 4 for the case of a hexagonal cell geometry. Note that any closed cell geometry could be used for the individual cells such as rectangular or square configurations. The device disclosed in FIGS. 2, 3 and 4 is an N-channel device but it will be apparent to those skilled in the art that a P-channel device could also employ the invention to be described.

In the example given herein, the chip consists of an N+ body of silicon 15 which has an N− epitaxial layer 16 grown thereon. The N− layer 16 contains a plurality of base diffusions such as the P+ base diffusions 17, 18 and 19 which are shown as having a hexagonal geometry. Any other geometry could be used. Layer 16 also has the P+ diffusion 20 which is formed simultaneously with the bases. The P+ diffusion 20 underlies the complete area of the source pad 11 in FIG. 1. A similar P+ diffusion (not shown) underlies the full extent of the gate pad 12 in FIG. 1.

Each of the P+ cells such as cells 17, 18 and 19 receives a hexagonal source diffusion shown as source diffusions 30, 31 and 32, respectively. A similar arrangement of cells is shown in FIG. 4 where hexagonal P+ cells 21, 22 and 23 receive source diffusions 24, 25 and 26, respectively. The annular regions between the exterior of the source diffusions 24, 25, 26, 30, 31 and 32 and the base regions 24, 25, 26, 17, 18 and 19, respectively, define respective hexagonal channels. Each of these channels is covered by a respective gate electrode, shown in FIGS. 3 and 4 as the polysilicon gate lattice 40 which has lattice sections overlying each of the channels. The polysilicon gate lattice 40 is supported above the surface of the silicon chip 10 and is, in effect, encapsulated in a lattice configured silicon oxide layer 41. Note that the layer 41 has an extending region 42 which extends over the surface of the silicon and underlies the full area of the source electrode pad 11. Similarly, the oxide 42 will also underlie the conductive material of the gate pad 12.

The insulation layer 41 may consist of several insulation layers. It can, for example, include a very thin silicon dioxide layer, for example, 1,000 Angstroms directly beneath the gate segments 40. The upper layer of encapsulating insulation layer 41 can be a reflowed silox formed above and around the sides of gate lattice 40 to ensure good insulation of the gate 40 from the source electrode. Note that the insulation layer 41 extends over only a portion of the outer periphery of the source diffusions 30, 31 and 32 in FIG. 3 and 21, 22 and 23 in FIG. 3 to enable subsequent contact to these source regions.

An aluminum sheet electrode 60, shown in FIGS. 3 and 4, then overlies the full surface of the chip and makes contact to the inner periphery of each of the source diffusions and to the central exposed P+ region of their respective bases. Sheet 60 is divided into a smaller gate pad section 12 and the larger source electrode which extends to the source pad 11. Gate lattice 40 is appropriately connected to gate pad region 12, as shown in the above-noted copending application. Note that the source electrode extends over the full extent of oxide layer 42. Note also that at the edge of the chip, shown in FIG. 4, the pad portion 11 of electrode 60 falls short of the edge of the chip at edge section 61. A channel stopper electrode 62 then is provided in the usual manner and is connected to the underlying N-material and to the drain electrode 13.

The entire upper surface of the device, except for the source and gate pads, is covered by an oxide layer or other suitable insulation layer 70 to protect the upper surface of the device. This upper layer 70 is removed in the area of the source pad 11, as shown in FIGS. 1, 3 and 4 and is also removed in the area of the gate pad 12.

In prior art devices of this type and particularly in prior art vertical conduction high power MOSFET devices employing a plurality of parallel-connected cells, it has been found that cells sometimes fail in the area adjacent the boundary of the source pad 11 or gate pad 12 when the device is operated in a diode mode. Thus, the device shown in FIGS. 3 and 4 can operate in a MOSFET mode or in a diode mode, depending upon the potential of the source 60 and of the drain 13. When the drain 13 is positive and the source 60 is negative, device conduction is controlled by the MOSFET mode. Thus, when a suitable potential is applied to the gate 40, the channel region between the external periphery of the individual sources and the outer periphery of their respective bases will become inverted so that a conduction path is formed from drain 13 to source 60 when a gate potential is applied. However, when the source and drain potentials are reversed and the source electrode 60 is positive, the entire device operates as a forward-biased diode having the diode junction formed between the P+ base regions and the N-body regions.

When the device is operating as a diode, each of the 6,000 or more cells of the device conduct current in parallel. The failure of diode elements surrounding the periphery of the connection pads was unexplained until it was recognized that the P+ region 20, which was very weakly connected to the pad 11, was weakly injecting minority carriers into the N-body during the time that the device acted as a MOSFET transistor. When the potential between the source electrode 60 and drain electrode 13 reversed, the junction formed by region 20 was unable to efficiently collect these injected carriers, so that these carriers preferentially were swept into the individual cells surrounding the pad such as the cells including sources 32 and 26 in FIGS. 3 and 4, respectively. These cells could readily collect the carriers which were previously injected from the region 20 since they are very firmly connected to the source electrode 60. Consequently, they become more efficient diodes than the other diodes farther removed from the pad 11. Since the device operates as a minority carrier device when operating as a diode, these cells tended to rapidly conduct increasingly more than their share of the current flowing through the device until they failed.

In accordance with the invention, a direct electrical connection is made from the source electrode 60 at the periphery of pad 11 to the periphery of the underlying P+ region 20 to make it a more efficient minority carrier collector when the device is operated in the diode mode. Similarly, a connection is made from the source electrode 60 at the periphery of gate pad 12 to the underlying P+ region.

For example, as shown in FIGS. 2, 3 and 4, a plurality of openings are formed in the oxide 42 at regions identified particularly in FIG. 2 by the numerals 80, 81 and 82 and which are disposed around the periphery of the pad. Thus, during the time the metal electrode 60 is applied over the surface of the device, connection will be made, as shown by the connection point 86 in FIG. 3, at region 82 to the P+ region 20. A similar opening 90 is formed at the region of the source pad 11 through which the section of FIG. 4 has been taken and a connection 91 is made from the source electrode 60 to the underlying P+ region 20 by the connection point 91.

The number or spacing of connection points is not critical. It has been found satisfactory to have a connection point at a point adjacent approximately every other cell element. A similar arrangement of connection points from the source electrode surrounding the outer periphery of the gate pad 12 to the underlying P+ region beneath the gate pad and through the spacing oxide is also provided but is not shown.

In an exemplary device, the source pad 11 had the dimensions of 30 mils by 25 mils. About 40 connection points surrounded the periphery of the source pad which had a separation of about 3 mils from one another. The connection points can be inwardly spaced from the effective edge of the pad by a distance approximately equal to the width of a cell which might be approximately 1 mil.

The arrangement is easily incorporated into the existing manufacturing process employed for the device as disclosed in copending application Ser. No. 451,795, filed Dec. 21, 1982, entitled "Structure and Method of Manufacture of High Power MOSFET Device" in the name of Daniel M. Kinzer, referred to above, and has substantially eliminated failure of devices operated in the diode mode.

Although the present invention has been described in connection with a preferred embodiment thereof, many variations and modifications will now become apparent to those skilled in the art. It is preferred, therefore, that the present invention be limited not by the specific disclosure herein, but only by the appended claims.

What is claimed is:

1. A metal oxide semiconductor field effect transistor comprising a semiconductor wafer, a plurality of base regions of one conductivity type symmetrically and laterally distributed over at least a portion of the area of one surface of said wafer; at least the portion of said wafer receiving said plurality of base regions being of the other conductivity type; a respective source region of said other conductivity type in each of said base regions, each of said source regions being laterally spaced from the periphery of their said respective base regions to define respective annular channel regions capable of inversion within their said respective base region; an enlarged area base region of said one conductivity type; said enlarged area base region laterally displaced from said plurality of base regions and extending to said one surface of said wafer; an insulation layer overlying each of said channel regions and extending over said enlarged area base region; conductive gate electrode means disposed atop said insulation layer and over each of said channel regions; a source electrode means in contact with each of said source regions and in contact with each of said plurality of base regions; a drain electrode connected to the opposite surface of said wafer; an enlarged area source electrode pad continuous with said source electrode means and overlying said insulation layer which extends over said enlarged base region; said source electrode pad having a peripheral region disposed adjacent said source electrode means; and a plurality of spaced connection means electrically connecting respective portions of said source electrode pad adjacent to said periphery to said enlarged base region beneath said pad whereby said enlarged base region can efficiently collect minority carriers when said base regions are forward biased relative to said portion of said wafer which receives said plurality of base regions.

2. The transistor of claim 1 wherein said plurality of spaced connection means are generally equally spaced conductive projections from said source pad means which extend through said insulation layer and are connected to said enlarged base region.

3. The transistor of claim 1 wherein said insulation layer consists of silicon dioxide.

4. The transistor of claim 1 wherein said source electrode means and said source electrode pad consist of a single sheet of conductive material.

5. The transistor of claim 1 wherein said one conductivity type is the P type.

6. The transistor of claim 1 wherein the outer periphery of said base regions and of said respective source regions is polygonal.

7. The transistor of claim 6 wherein said outer periphery is hexagonal.

* * * * *